April 22, 1969 HUNG C. LIN ET AL 3,440,502

INSULATED GATE FIELD EFFECT TRANSISTOR STRUCTURE WITH REDUCED CURRENT LEAKAGE

Filed July 5, 1966

WITNESSES:

Bernard R. Gieguez

James F. Young

INVENTORS
Hung C. Lin and
Philip S. Shiota.

BY Gordon H. Telfer

ATTORNEY

United States Patent Office 3,440,502

Patented Apr. 22, 1969

3,440,502

INSULATED GATE FIELD EFFECT TRANSISTOR STRUCTURE WITH REDUCED CURRENT LEAKAGE

Hung C. Lin, Silver Spring, Md., and Philip S. Shiota, Santa Clara, Calif., assignors to Westinghouse Electric Corporation, Pittsburgh, Pa., a corporation of Pennsylvania Filed July 5, 1966, Ser. No. 562,591
Int. Cl. H01l *11/14*
U.S. Cl. 317—235 4 Claims

ABSTRACT OF THE DISCLOSURE

An insulated gate field effect transistor that includes, in addition to the usual elements, an additional region of material of conductivity type opposite to that of the source and drain regions and with appreciably higher impurity concentration than the material in which the source and drain regions are disposed wherein the additional region has a configuration surrounding the source and drain and extending within the channel region to prevent an inversion layer leakage path between the source and drain regions.

This application is directed to MOS field effect transistor structures with means for minimizing leakage paths outside the channel region.

MOS field effect transistors are known devices that offer advantages over both bipolar transistors and junction type field effect transistors particularly in providing higher input impedances.

In the operation of MOS field effect transistors, it is intended that the current flow between source and drain regions be controlled by the potential on the gate electrode disposed over an insulating layer covering the channel region between the source and drain regions. It is the case, however, that paths between the source and drain regions outside of the channel region exist that may permit current leakage despite application of suitable potentials to the gate electrode. Thus, the devices tend to conduct some current even though they are supposed to be in the cutoff condition. Consequently, the drain output impedance is lowered or, when the device is used as a switch, its off impedance is lower than desirable.

A possible solution to the problem would be to dispose the gate electrode in a configuration such that it surrounds the source and drain regions. However from a device fabrication point of view, this is impractical. In MOSFET's formed in integrated circuits, the problem is more severe due to metallic interconnections, as for the source or drain connections, that tend to enhance the formation of an inversion layer under the oxide passivating layer, particularly if the metallic layer has a positive potential applied to it, in considering N channel devices. Usually, the drain contact of an N channel depletion mode transistor is maintained at a positive potential and thus such structures have been difficult to integrate by previous techniques. Even in the case of enhancement mode MOSFET's, some variation or instability in operation is exhibited due to these external leakage paths.

It is, therefore, an object of the present invention to provide improved MOSFET structures whose operation is not influenced by leakage paths outside the channel region.

Another object is to provide MOSFET's either of depletion mode or enhancement mode types that may be formed in integrated circuits without adverse effects on their operation.

The invention, briefly, achieves the above-mentioned and additional objects and advantages by providing an MOS field effect transistor structure that includes in addition to the usual elements an additional region of material of conductivity type opposite to that of the source and drain regions and having appreciably higher impurity concentration than the material in which the source and drain regions are disposed. The additional region has a portion enclosing the source and drain regions and also portions extending within the channel region, although not joined, to prevent an inversion layer providing a leakage path between the source and drain regions. The additional region serves as a "guard band" whose conductivity is high enough to prevent the creation of an inversion layer even though there may be a metallic layer disposed on top of it on the oxide passivating layer. It is preferred that the additional region be spaced from both the source and drain regions to preserve a high breakdown voltage.

The invention, together with the above-mentioned and additional objects and advantages of it will be better understood by referring to the following description taken with the accompanying drawing, wherein.

Figure 1:
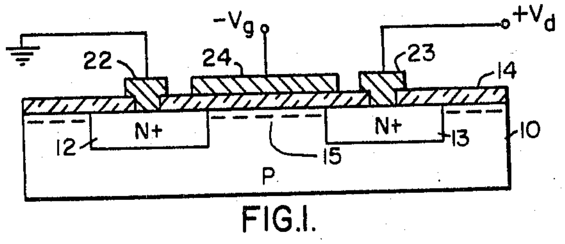
FIGURES 1 and 2 are, respectively, cross-sectional elevation and plan views of an MOS field effect transistor in accordance with the prior art that may be improved in accordance with this invention.
Figure 2:
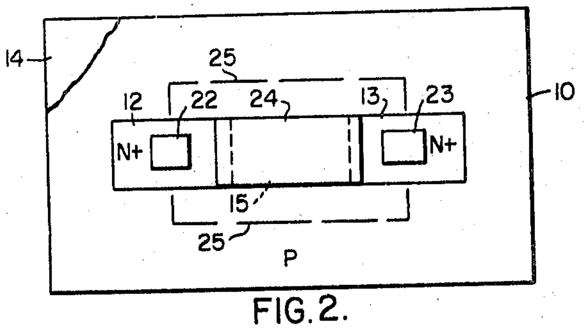

Referring to FIGS. 1 and 2, an MOS field effect transistor is illustrated that includes a P-type substrate 10 and N-type source and drain regions 12 and 13, respectively. The substrate may be of silicon, although other semiconductive materials may be used, and the regions 12 and 13 produced by selective diffusion using oxide masking techniques. A layer of insulating material 14, such as one of silicon dioxide, is disposed on the upper surface except where contacts 22 and 23, respectively, make contact with the regions 12 and 13. An additional contact 24 is disposed on the surface of the insulating layer 14 over the portion of the substrate 10 disposed between the regions 12 and 13. This portion of the structure, referred to as the channel region 15, by reason of the presence of insulating layer 14 has a layer of negative charges hence inverting its conductivity type to N-type and providing an N channel MOS transistor.

An additional contact may be disposed on the substrate 10 although in some applications it may be left floating.

It will be understood that a device like that of FIG. 1, and those subsequently described in accordance with this invention, may be made with the semiconductivity type of the various regions reversed.

Devices like that shown in FIG. 1 may be made and operated in two ways. The differences may result in part from the nature of the fabrication process employed to make the structure and also from the manner in which potentials are applied to it. In some devices, there is appreciable conduction from source to drain with zero voltage on the gate. Such a device is called a depletion mode device. The conduction is decreased, in an N channel device, by application of more negative voltages to the gate. Enhancement mode devices on the other hand have essentially zero current at zero gate voltage but increasingly larger currents are conducted through application of more positive gate bias voltages. Both types may be improved in accordance with this invention.

In the usual manner of operation, a voltage is applied across the source and drain regions to provide carrier conduction from source to drain. In an N channel device, this conduction is by means of electrons and the applied potential would be as indicated ($+V_d$). A gate bias, $-V_g$, is applied to the gate electrode 24.

The conditions that create an inversion layer in the channel region 15 also create an inversion layer elsewhere in the structure as is indicated by the current leakage paths 25 illustrated in FIG. 2. Such paths remote from the channel region are essentially not influenced by potentials applied to the gate electrode 24 and hence they conduct even when the device should be cutoff and adversely effect its usefulness in some applications. Furthermore, it will be understood that in integrated circuits where such a structure is formed, it is desirable that conductive interconnections extend over the surface of insulating layer 14 to the various contacts thus increasing the likelihood of strengthening the inversion layer particularly if positive potential is applied to such a conductive interconnection as would be the case of one connected to the drain contact in the illustrated structure.

Figure 3:
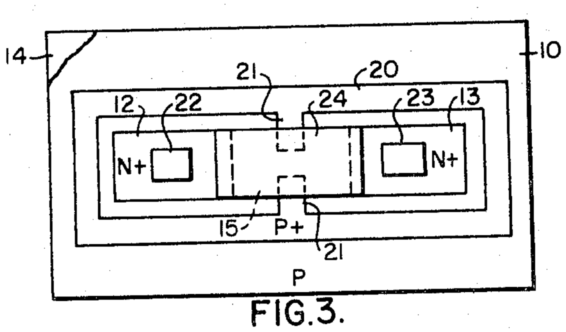
FIG. 3 is a plan view of an embodiment of the present invention.

FIG. 3 illustrates an embodiment of the invention that avoids the problems referred to in connection with FIGS. 1 and 2. The elements of the structure are the same except that there is in addition a P+ region 20 that encloses the source and drain regions 12 and 13 by a major portion and has second and third portions 21 that extend within the channel region 15 so that there is no possibility of the creation of current paths connecting the source and drain regions other than through the channel region because the additional region is of sufficient conductivity to prevent the occurrence of an inversion layer.

In the usual case in which the device is made in silicon and the insulating layer 14 is of silicon dioxide, it has been found by experience that the inversion layer on the surface of a P-type region will occur if the P-type impurity concentration is no more than the order of about $10^{17}$ atoms per cubic centimeter. Consequently, this is an essential requirement for the channel region 15 of such a device. For the additional region 20, it is necessary that the surface concentration be sufficiently great to avoid or prevent the inversion layer, typically at least about the order of $10^{18}$ atoms per cubic centimeter.

As shown in FIG. 3, there is a spacing of material of the P-type substrate 10 between the guard band 20 and the source and drain regions 12 and 13 which is desirable in order to preserve a high breakdown voltage. If the P+ guard band 20 formed a junction with the N+ source and drain regions, the breakdown voltage would be lowered and hence it is preferred that the guard band form a junction only with the more lightly doped N-type inversion layer that exists on the surface of region 10.

Figure 4:
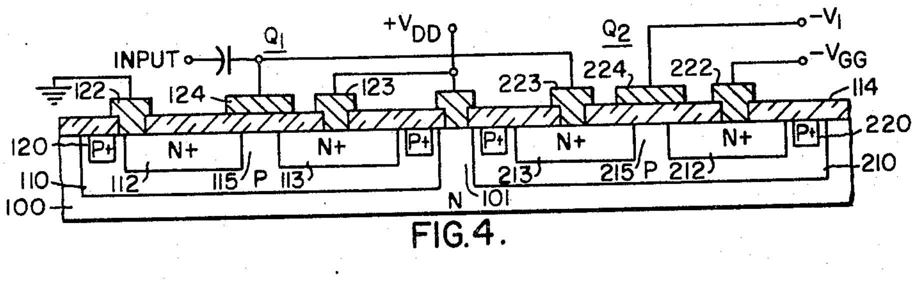
FIG. 4 is a partial sectional view of a semiconductor integrated circuit embodying the present invention.

FIG. 4 illustrates the application of the invention in an integrated circuit. This is a portion of an integrated circuit formed in accordance with the teachings of an article by Lin and Van Beek in National Electronics Conference Proceedings, October 1965, and illustrates the application of an MOS transistor $Q_2$ to provide a high gate bias resistance for another MOS transistor $Q_1$. The above-mentioned article should be referred to for further information regarding such apparatus. This structure includes an N-type substrate 100 in which pockets of P-type epitaxial material 110 and 210 are formed by epitaxial growth and subsequent diffusion of N-type isolation walls 101. Then the source regions 112 and 212 and drain regions 113 and 213 are formed by selective diffusion as are the guard bands 120 and 220 in accordance with this invention. Contacts (reference numerals having the same last two digits as corresponding ones of FIG. 3) are provided to each of the source and drain regions and to the insulating layer 114 over the channel regions 115 and 215. As can be seen, the drain region 113 of $Q_1$ has applied to it a positive potential that would enhance any inversion layer existing in the surface of the P-type region. However in accordance with this invention such inversion layer cannot extend to the source region 112 or to the isolation wall 101. The guard bands 120 and 220 in FIG. 4 are as illustrated in FIG. 3 and would include portions extending into the channel regions 115 and 215 for complete isolation of the source and drain regions.

While the present invention has been shown and described in a few forms only, it will be understood that various modifications may be made without departing from the scope of the invention.

What is claimed is:

1. An insulated gate field effect transistor comprising: a first region of a first type of conductivity; source and drain regions both of a second type of conductivity in said first region and defining a channel region therebetween at a surface of said first region; contacts on each of said source and drain regions and on an insulating layer disposed on the surface of said channel region; an additional region in said first region also of said first conductivity type and having appreciably higher impurity concentration than said first region, said additional region having a first portion enclosing said source and drain regions and also having second and third portions extending within said channel region on opposite sides thereof to prevent an inversion layer providing a leakage path between said source and drain regions.

2. The subject matter of claim 1 wherein: said additional region is spaced by material of said first region from both said source and drain regions.

3. The subject matter of claim 1 wherein: said contact on said drain region has a conductive interconnection joined with it that extends over said first region and said additional region and is spaced from them by an insulating layer.

4. The subject matter of claim 1 wherein: said regions are of impurity doped silicon, said first region and said additional region are of P-type conductivity, said insulating layer is of silicon dioxide, said first region has a surface concentration of no more than about the order of about $10^{17}$ atoms per cubic centimeter and said additional region has a surface concentration of at least about the order of $10^{18}$ atoms per cubic centimeter.

References Cited

UNITED STATES PATENTS

| | | | |
|---|---|---|---|
| 3,354,362 | 3/1967 | Zuleeg | 317—235 |
| 3,340,598 | 9/1967 | Hatcher | 29—571 |
| 3,278,853 | 10/1966 | Lin | 330—24 |
| 3,233,123 | 2/1966 | Heiman | 307—88.5 |
| 3,327,182 | 6/1967 | Kinsinko | 317—235 |
| 3,341,755 | 9/1967 | Husher | 317—235 |

JOHN W. HUCKERT, *Primary Examiner.*

M. EDLOW, *Assistant Examiner.*

U.S. Cl. X.R.

317—234